(12) United States Patent
Suzuki et al.

(10) Patent No.: US 6,893,204 B1
(45) Date of Patent: May 17, 2005

(54) SUBSTRATE DELIVERING ROBOT

(75) Inventors: Takeo Suzuki, Fukuoka (JP); Masaru Ogasawara, Fukuoka (JP); Toshio Omata, Fukuoka (JP)

(73) Assignee: Kabushiki Kaisha Yaskawa Denki, (JP)

( * ) Notice: Subject to any disclaimer, the term of this patent is extended or adjusted under 35 U.S.C. 154(b) by 0 days.

(21) Appl. No.: 10/450,652

(22) PCT Filed: Sep. 17, 2001

(86) PCT No.: PCT/JP01/08078

§ 371 (c)(1),
(2), (4) Date: Jun. 16, 2003

(87) PCT Pub. No.: WO02/49099

PCT Pub. Date: Jun. 20, 2002

(30) Foreign Application Priority Data

Dec. 15, 2000 (JP) .............................. 2000-381449

(51) Int. Cl.⁷ .............................................. B25J 18/04

(52) U.S. Cl. ................................ 414/744.5; 74/490.03; 901/15; 901/23

(58) Field of Search .................... 414/744.5, 744.1; 901/15, 23, 24; 74/490.03

(56) References Cited

U.S. PATENT DOCUMENTS

| | | | |
|---|---|---|---|
| 6,037,733 A * | 3/2000 | Genov et al. ............. | 901/15 X |
| 6,102,649 A * | 8/2000 | Ogawa et al. ........... | 414/744.5 |
| 6,234,738 B1 * | 5/2001 | Kimata et al. ............... | 414/416 |
| 6,326,755 B1 * | 12/2001 | Babbs et al. ................ | 901/8 X |
| 6,737,826 B2 * | 5/2004 | Gilchrist ................. | 318/568.21 |

FOREIGN PATENT DOCUMENTS

| | | |
|---|---|---|
| JP | 7-142551 | 6/1995 |
| JP | 9-63939 A | 3/1997 |
| JP | 9-205127 A | 8/1997 |
| JP | 10-247674 A | 9/1998 |
| JP | 2000-133690 A | 5/2000 |
| JP | 2000-167788 A | 6/2000 |
| WO | WO00/28587 A1 | 5/2000 |

* cited by examiner

*Primary Examiner*—Donald W. Underwood
(74) *Attorney, Agent, or Firm*—Sughrue Mion, PLLC

(57) ABSTRACT

A robot for carrying a substrate in which minimum turning radius is small when the arm is retracted although a plurality of forks are provided and installation area can be minimized. The robot comprises a fixed base, a first turnable arm linked with the fixed base, a second turnable arm linked with the first arm, and a turnable fork linked with the second arm, wherein the fork comprises a plurality of first and second independent forks. The first and second forks are fixed coaxially and vertically in two stages to the forward end part of the second arm such that they can turn independently and first and second fork drive motors are disposed in the second arm.

1 Claim, 6 Drawing Sheets

SUBSTRATE DELIVERING ROBOT

TECHNICAL FIELD

The present invention relates to a substrate delivering robot to be used in a semiconductor manufacturing apparatus.

BACKGROUND ART

As shown in FIG. 7(a), a conventional general substrate delivering robot 1A for delivering a thin plate-shaped substrate such as a semiconductor wafer or a liquid crystal glass substrate is constituted by a fixed base 2A, a first arm 3A coupled turnably to the fixed base 2A, a second arm 4A coupled turnably to the first arm 3A, and a fork 5A for substrate mounting which is turnably coupled to the second arm 4A. In the case in which such a substrate delivering robot can be caused to mount two substrates at the same time, the fork 5A having a central part turnably supported, one of ends provided with a processed substrate mounting section 5Aa for mounting a processed substrate and the other end provided with an unprocessed substrate mounting section 5Ab for mounting an unprocessed substrate is coupled turnably to the tip portion of the second arm 4A (for example, JP-A-7-142551).

In such a conventional substrate delivering robot capable of holding two substrates at the same time, however, one long fork is used. For this reason, there is a problem in that the minimum turning radius of the substrate delivering robot is large also in the contraction state of an arm, resulting in an increase in the installation area of the robot.

DISCLOSURE OF THE INVENTION

The invention has been made to solve such a problem and has an object to provide a substrate delivering robot capable of decreasing the minimum turning radius in the contraction state of the robot and minimizing an installation area even if a plurality of forks are provided.

In order to solve the problem, the invention provides a substrate delivering robot having a fixed base, a first arm coupled turnably to a substantial center part of the fixed base, a second arm coupled turnably to the first arm and a fork coupled turnably to the second arm, wherein the fork is constituted by a plurality of forks including a first fork and a second fork which are independent of each other, and the first fork and the second fork are turnably attached to a tip portion of the second arm concentrically in two upper and lower stages independently of each other and a motor for driving the first fork and a motor for driving the second fork are provided in the robot, for example, the second arm.

As described above, according to the invention, it is possible to obtain such a great advantage as to provide a substrate delivering robot capable of decreasing a minimum turning radius in the contraction state of the arm and minimizing an installation area even if a plurality of forks are provided.

BEST MODE OF CARRYING OUT THE INVENTION

An embodiment of the invention will be described below with reference to the drawings.

Figure 1A:
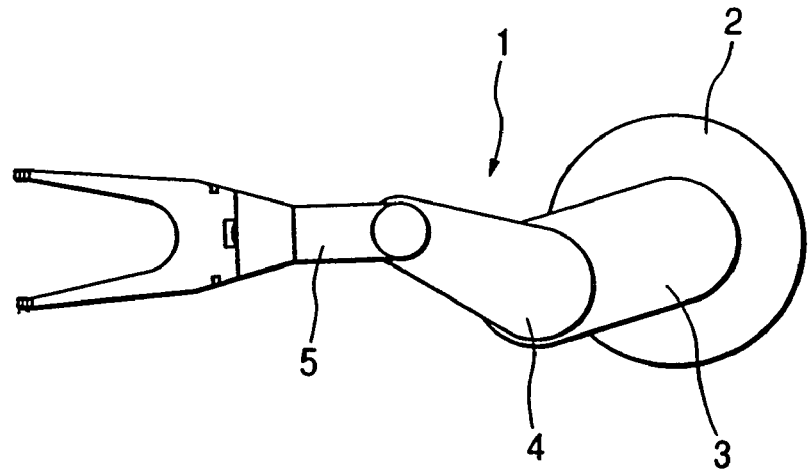
FIGS. 1(a) and 1(b) show the side views showing a substrate delivering robot according to an embodiment of the invention, FIG. 1(a) showing a state in which an arm is contracted and FIG. 1(b) showing a state in which the arm is extended.
Figure 1B:
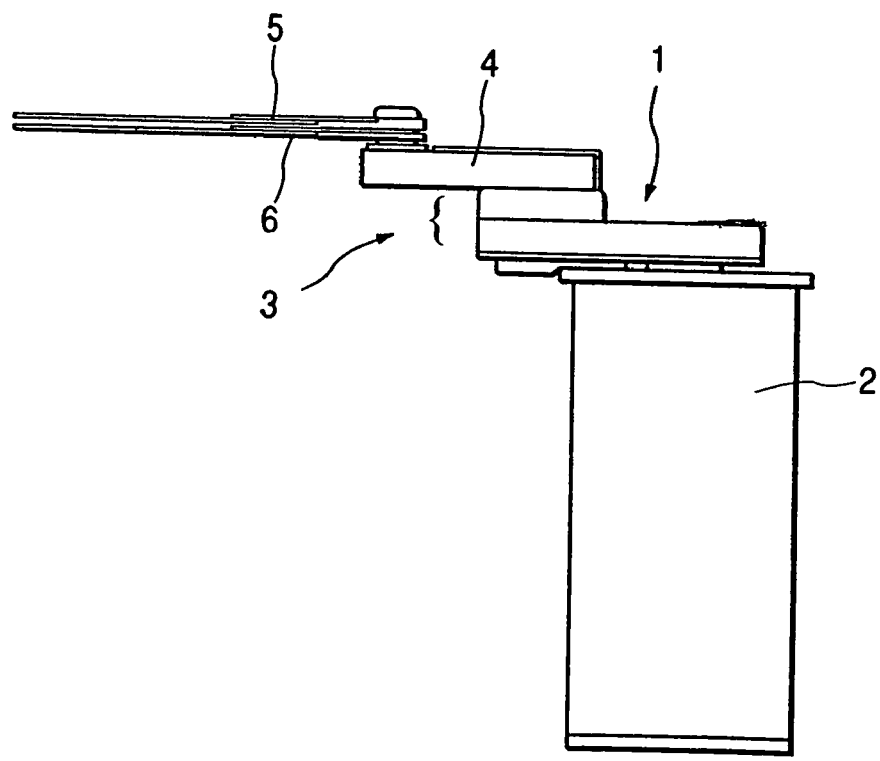
Figure 2A:
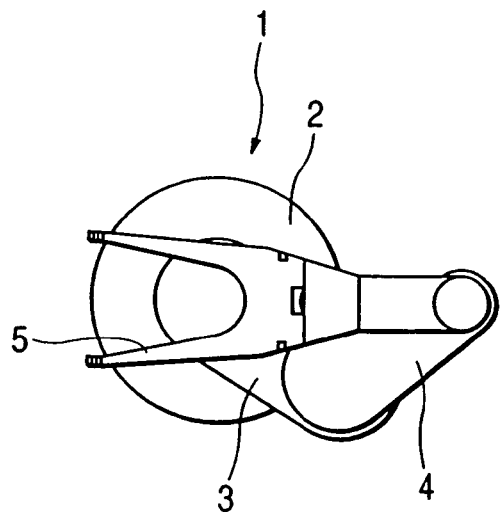
FIGS. 2(a) and 2(b) is a plan view showing the substrate delivering robot in FIG. 1, FIG. 2(a) showing a state in which the arm is contracted and FIG. 2(b) showing a state in which the arm is extended.
Figure 2B:
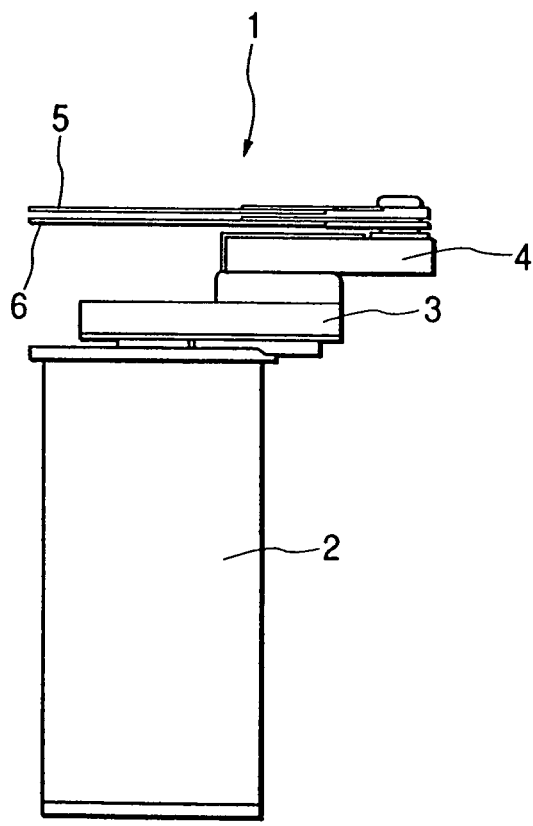
Figure 3:
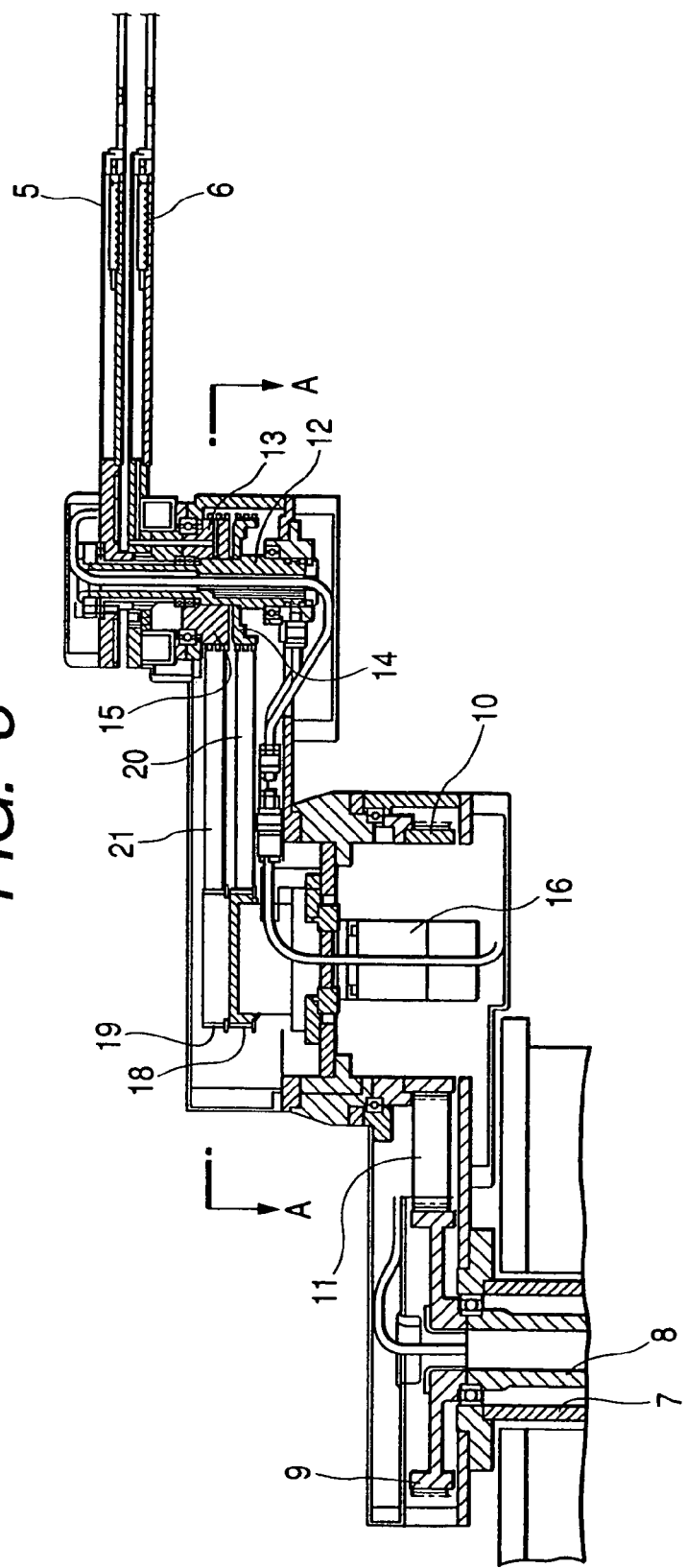
FIG. 3 is a side sectional view showing the structure of an arm section.
Figure 4:
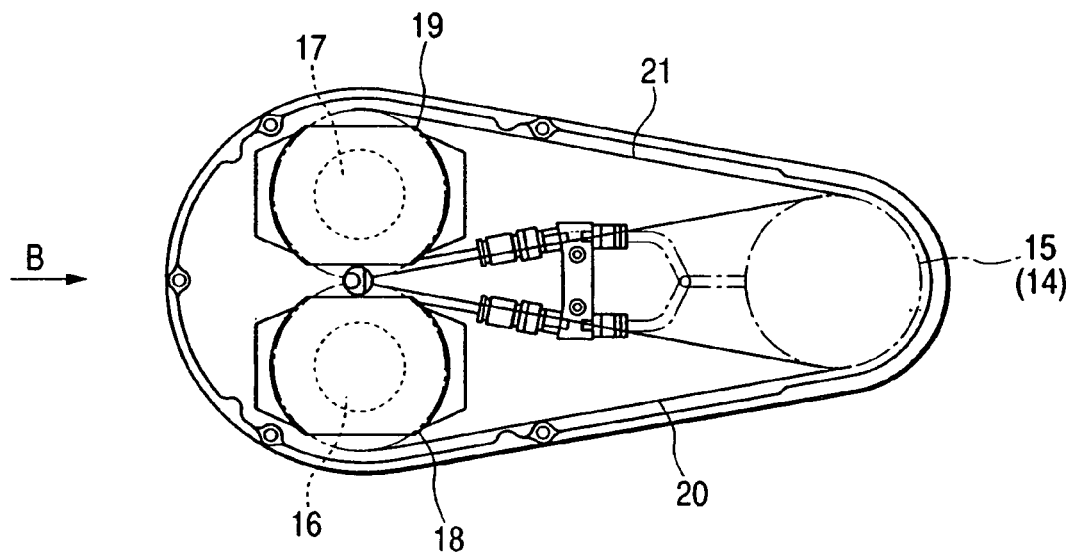
FIG. 4 is a sectional view taken along an A—A line in FIG. 3.
Figure 5:
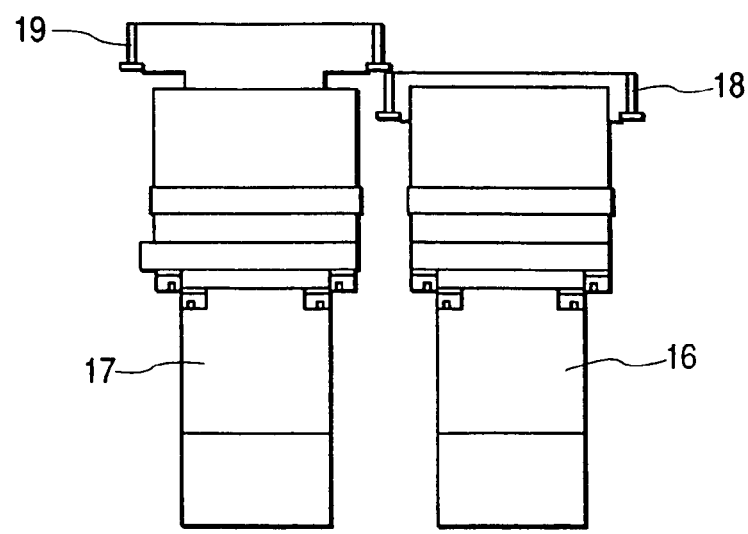
FIG. 5 is a view showing two motors in FIG. 3 seen in a direction of B.
Figure 6A:
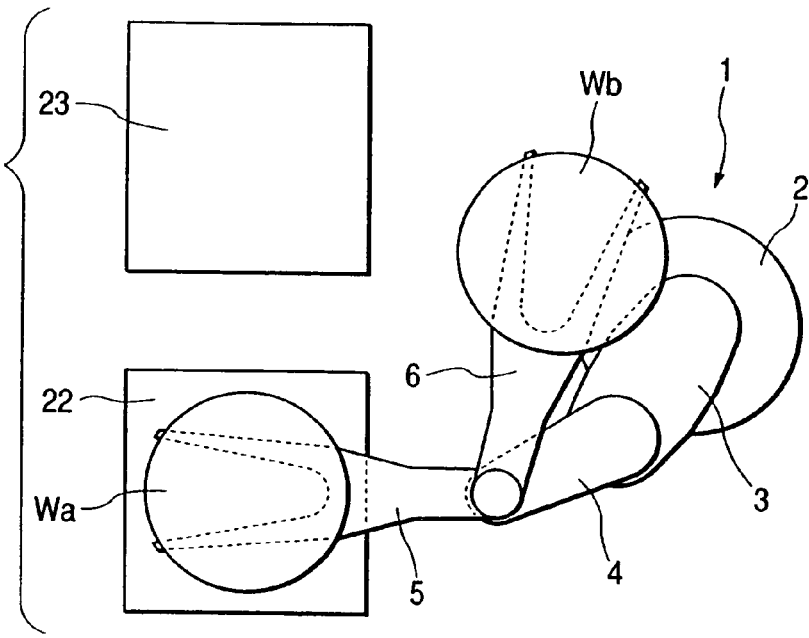
FIG. 6 is a plan view showing the operation of the substrate delivering robot according to the invention, FIG. 6(a) showing a state in which a processed substrate is taken out and FIG. 6(b) showing a state in which an unprocessed substrate is mounted.
Figure 6B:
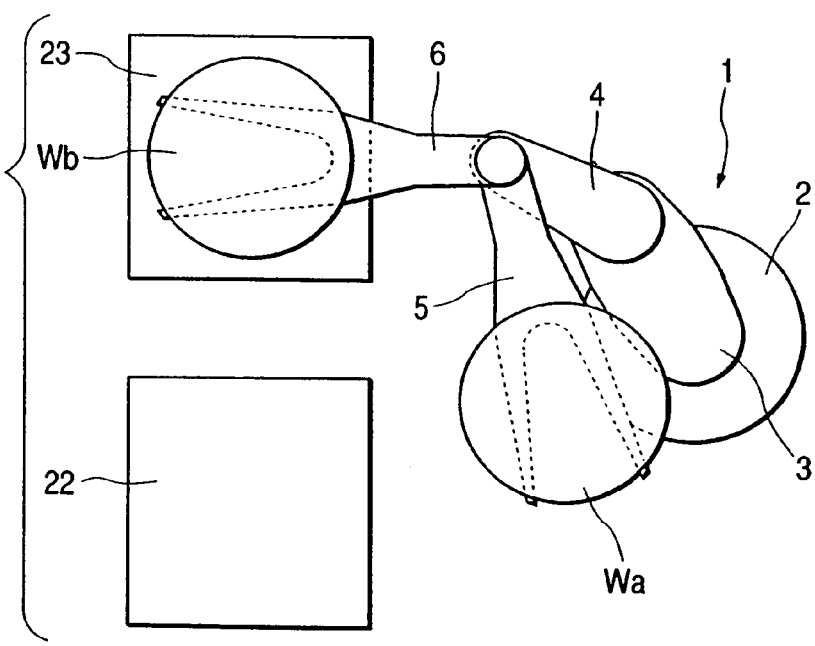
Figure 7A:
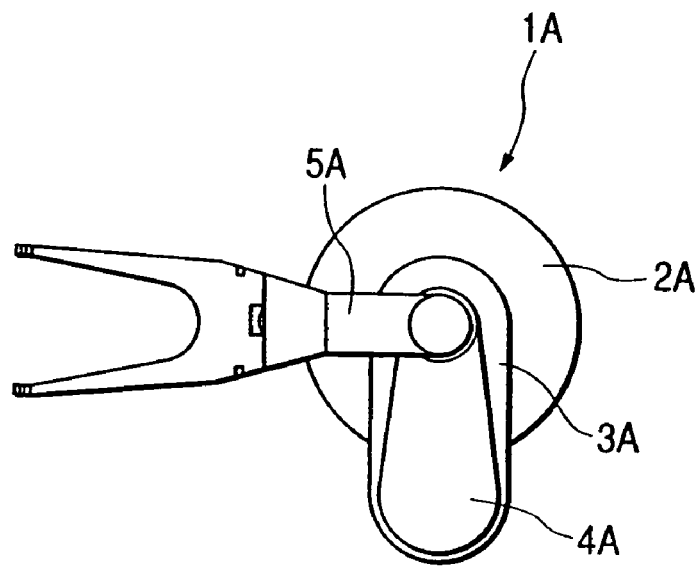
FIGS. 7(a) and 7(b) show the plan views showing a conventional substrate delivering robot, FIG. 7(a) showing an example of a substrate delivering robot having one fork and FIG. 7(b) showing an example of a substrate delivering robot having two forks.
Figure 7B:
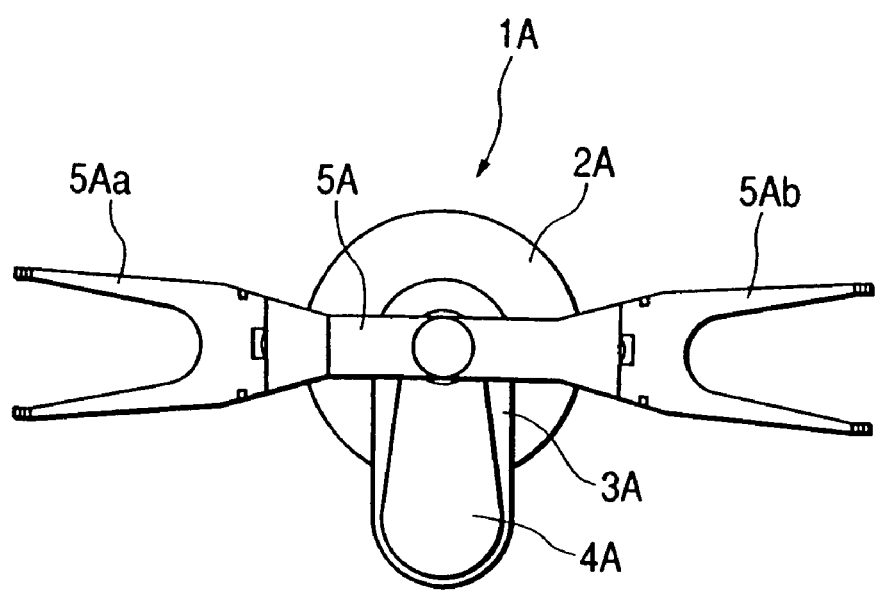

FIG. 1 shows a state in which an arm is extended in a substrate delivering robot according to the embodiment of the invention, FIG. 1(a) being a plan view and FIG. 1(b) being a side view. FIG. 2 shows a state in which the arm is contracted in the substrate delivering robot according to the embodiment of the invention, FIG. 2(a) being a plan view and FIG. 2(b) being a side view. FIG. 3 is a side sectional view showing the structure of an arm section, FIG. 4 is a sectional view taken along an A—A line in FIG. 3, FIG. 5 is a view showing two motors in FIG. 3 seen in a direction of B, and FIGS. 6(a) and 6(b) show the plan views showing the operation of the substrate delivering robot according to the invention, FIG. 6(a) showing a state in which a processed substrate is taken out and FIG. 6(b) showing a state in which an unprocessed substrate is mounted.

As shown in FIGS. 1(a) and 1(b) and FIGS. 2(a) and 2(b), a substrate delivering robot 1 according to the invention comprises a fixed base 2, a first arm 3 coupled turnably to the fixed base 2, a second arm 4 coupled turnably to the first arm 3, and a first fork 5 and a second fork 6 which are coupled turnably to the second arm 4. The first arm 3 can be moved vertically by an up-down mechanism provided in the fixed base 2 which is not shown.

The first arm 3, the second arm 4, the first fork 5 and the second fork 6 are constituted as shown in FIGS. 3 to 6.

Motors for driving the first arm 3 and the second arm 4 are provided in the fixed base 2 respectively (not shown), and an output shaft thereof is constituted by two concentric shafts. An outer one of the two concentric shafts is an output shaft 7 for driving the first arm and is directly coupled to the lower part of the first arm 3. Moreover, an inner shaft is an output shaft 8 for driving the second arm and is protruded into the first arm 3, has a tip portion to which a pulley 9 is attached, is connected through a belt 11 to a pulley 10 coupled to the lower part of the second arm 4, and is thus coupled to the second arm 4.

The first fork 5 and the second fork 6 which are independent of each other are turnably attached to the tip portion of the second arm 4 concentrically in two upper and lower stages. Shafts for supporting the first fork 5 and the second fork 6 are constituted by two concentric shafts. The first fork 5 on the upper side is coupled to an inner shaft 12 and the second fork 6 on the lower side is coupled to an outer shaft 13. Pulleys 14 and 15 are attached to the inner shaft 12 and the outer shaft 13 with height positions varied in lower parts, respectively.

Moreover, motors 16 and 17 for driving the first fork 5 and the second fork 6 are arranged in the first arm 3 which is located in the vicinity of the turning center portion of the second arm 4 and the height positions of pulleys 18 and 19 are made different from each other as shown in FIG. 6. Although the pulley 14 and the pulley 18 are connected to each other through a belt 20 and the pulley 15 and the pulley 19 are connected to each other through a belt 21, the belts 20 and 21 do not interfere with each other.

With such a structure, a substrate is to be delivered by means of the substrate delivering robot as shown in FIGS. 6(a) and 6(b).

As shown in FIG. 6(a), first of all, the second fork 6 (or the first fork 5) set to hold an unprocessed substrate Wb is turned and moved toward the back side with the unprocessed substrate Wb held and is caused to stand by in such a position as not to obstruct a work. In this state, a processed substrate Wa mounted on a processed substrate mounting table 22 is held and taken out by means of the first fork 5 (or the second fork 6).

As shown in FIG. 6(b), next, the first fork 5 holding the processed substrate Wa is turned and moved toward the back side in this state and is caused to stand by in such a position as not to obstruct the work, and the second fork 6 holding the unprocessed substrate Wb is turned forward and moved rectilinearly to mount the unprocessed substrate Wb on an unprocessed substrate mounting table 23.

In this case, one arm is provided and both the first fork 5 and the second fork 6 are protruded to be short from the tip portion of the second arm 4 and are only turned around the tip portion of the second arm 4. Also in a state in which the first arm 3 and the second arm 4 are contracted during an operation, therefore, a range in which a motion interferes with another fixed object is very small. Accordingly, the installation area of the substrate delivering robot 1 is reduced.

The invention is not restricted to the case in which the processed substrate Wa and the unprocessed substrate Wb are delivered by only the operation of the arm of the substrate delivering robot 1 but the substrate delivering robot 1 may be attached to a rectilinear moving device which is not shown and the arm operation of the substrate delivering robot 1 and the rectilinear movement of the rectilinear moving device may be combined to deliver the processed substrate Wa and the unprocessed substrate Wb.

Moreover, the motor 16 for driving the first fork and the motor 17 for driving the second fork may be provided in the fixed base 2. In the case in which the motors 16 and 17 are provided in the fixed base 2, two output shafts for fork driving are further provided concentrically in the output shafts 7 and 8 to be the two concentric shafts of the motors for driving the first arm 3 and the second arm 4, for example.

Similarly, the invention can be applied to a substrate delivering robot which does not have an up-down mechanism in the fixed base and can also be applied to a substrate delivering robot comprising two arms, for example. Furthermore, the number of the forks is not restricted to two but may be four.

INDUSTRIAL APPLICABILITY

The invention can be applied to a substrate delivering robot to be used in a semiconductor manufacturing apparatus and can be utilized in such a field as to manufacture and provide a substrate delivering robot capable of decreasing a minimum turning radius in the contraction state of an arm and minimizing an installation area even if a plurality of forks are provided.

What is claimed is:

1. A substrate delivering robot having a fixed base, a first arm coupled turnably to a substantial center part of the fixed base, a second arm coupled turnably to the first arm and a fork coupled turnably to the second arm, wherein the fork is constituted by a plurality of forks including a first fork and a second fork which are independent of each other, and the first fork and the second fork are turnably attached to a tip portion of the second arm concentrically in two upper and lower stages independently of each other and a motor for driving the first fork and a motor for driving the second fork are provided in the robot wherein the motor for driving the first fork and the motor for driving the second fork are provided in the first arm.

* * * * *